United States Patent [19]

Epstein

[11] 3,835,413

[45] Sept. 10, 1974

[54] CRYSTAL PHASE-LOCKED LOOP

[75] Inventor: Philip L. Epstein, Elizabeth, N.J.

[73] Assignee: Quindar Electronics, Inc., Springfield, N.J.

[22] Filed: June 16, 1972

[21] Appl. No.: 263,538

[52] U.S. Cl. .................................. 331/1 A, 331/12

[51] Int. Cl. .............................................. H03b 3/04

[58] Field of Search ......................... 331/12, 1 A, 36

[56] References Cited

UNITED STATES PATENTS

| | | | |
|---|---|---|---|
| 2,747,089 | 5/1956 | Norton | 331/12 |
| 3,101,448 | 8/1963 | Costas | 331/12 |
| 3,123,769 | 3/1964 | Meyer | 331/12 |
| 3,204,185 | 8/1965 | Robinson | 331/12 |
| 3,403,355 | 9/1968 | Takada | 331/12 |
| 3,405,369 | 10/1968 | Couvillon | 331/36 |
| 3,418,595 | 12/1968 | Loewenstern, Jr. | 331/12 |
| 3,456,196 | 7/1969 | Schneider | 331/12 |

FOREIGN PATENTS OR APPLICATIONS

| | | | |
|---|---|---|---|
| 1,161,206 | 8/1969 | Great Britain | 331/12 |

*Primary Examiner*—John Kominski

*Attorney, Agent, or Firm*—Morse, Altman, Oates & Bello

[57] ABSTRACT

A phase-locked loop comprises a crystal voltage controlled oscillator for generating an output signal having a frequency related to an input signal, a phase detector for selectively combining an incoming signal and the output signal of the crystal voltage controlled oscillator and for generating an output signal which contains the sum and difference frequencies of the combined signals, and a low pass filter for filtering out the sum frequency signal. The difference frequency signal at an output of the loop filter is applied to the crystal voltage controlled oscillator for controlling the frequency of the signal at the output thereof.

10 Claims, 3 Drawing Figures

PATENTED SEP 10 1974

3,835,413

CRYSTAL PHASE-LOCKED LOOP

BACKGROUND OF THE INVENTION

1. Field of Invention

The present invention relates to phase-locked loops and is directed generally towards a crystal phase-locked loop and, more particularly, towards a narrow band receiver using a crystal controlled phase-locked loop.

2. Description of the Prior Art

Phase-locked loop techniques are employed in wide bandwidth frequency shift keyed system for optimum demodulation of F.S.K. signals. A phase-locked loop includes a voltage controlled oscillator which generates a signal having a frequency proportional to a D.C. signal applied at an input terminal thereof. Due to the lack of frequency stability of the voltage controlled oscillator, phase-locked loops have not beem implemented in narrow band frequency shift keyed systems.

SUMMARY OF THE INVENTION

It is an object of the present invention to provide a crystal phase-locked loop particularly adapted for use in a narrow band receiver. The crystal phase-locked loop comprises a crystal voltage controlled oscillator for generating an output signal having a frequency related to an input signal, a phase detector for selectively combining an incoming signal and the output terminal of the crystal voltage controlled oscillator and for generating an output signal which contains the sum and difference frequencies of the combined signals, and a loop filter for filtering out the sum frequency signal. The signal at the output of the loop filter, the difference frequency signal, is applied to the crystal voltage controlled oscillator for controlling the frequency of the signal at the output thereof. The crystal voltage controlled oscillator is characterized by a PUT and TAKE circuit, including digital dividers and logic gates, for selectively combining crystal derived frequency signals and generating an output signal related to an input D.C. signal. The combination of crystal voltage controlled oscillator, phase detector and loop filter is such as to provide a crystal phase-locked loop particularly adapted for use in a narrow band receiver.

The invention accordingly comprises the system possessing the construction, combination of elements, and arrangements of parts that are exemplified in the following detailed disclosure, the scope of which will be indicated in the appended claims.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE INVENTION

Figure 1:
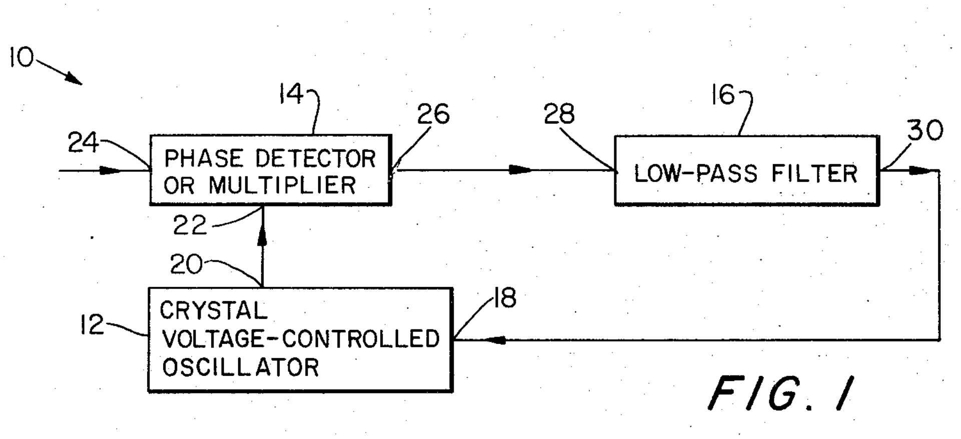
FIG. 1 is a block diagram of a crystal phase-locked loop.

Referring now to the drawings, in particular FIG. 1, there is shown a crystal phase-locked loop 10 comprising a crystal voltage controlled oscillator 12, a phase detector 14 and a loop filter 16. Crystal voltage controlled oscillator 12 generates an output signal having a frequency which is related to a signal applied to an input terminal 18 thereof from loop filter 16. The output signal of crystal voltage controlled oscillator 12 as at an output terminal 20 and an incoming signal are applied to phase detector 14 at input terminals 22 and 24, respectively. The signal at an output terminal 26 of phase detector 14 is fed to an input terminal 28 of loop filter 16. An output terminal 30 of loop filter 16 is connected to input terminal 18 of crystal voltage controlled oscillator 20.

The operation of phase-locked loop 10, by way of example, is such that, with the loop in the out-of-lock condition, phase detector 14 operates as a frequency mixer whose output signal contains the sum and difference frequencies of the incoming signal and the signal generated by crystal voltage controlled oscillator 12. The sum frequency is filtered out by loop filter 16, for example a low pass filter, whereby only the difference frequency or beat signal is presented at output terminal 30. The signal at output terminal 20 of crystal voltage controlled oscillator 12 changes as a function of the beat signal presented at input terminal 18 thereof. Phase detector 14 recognizes the new frequency generated by crystal voltage controlled oscillator 12 and generates a new control voltage which is applied to crystal voltage controlled oscillator 12 via low pass filter 16. The process continues until the frequency at output terminal 20 of crystal voltage controlled oscillator 12 is equal to the frequency of the incoming signal applied to input terminal 24 of phase detector 14. At this point, phase detector 14 generates a DC component whose magnitude is proportional to the phase difference between the incoming signal and the output signal of crystal voltage controlled oscillator 12. This DC component maintains phase-locked loop 10 in the phase-locked condition at the frequency of the incoming signal. As the frequency of the incoming signal deviates, the phase difference varies and the control voltage changes therewith. The lock-in or pull-in frequency and the time required for the phase-locked loop 10 to reach equilibrium are determined by the bandwidth and the characteristic of loop filter 16 as well as the maximum variable frequency range of crystal voltage controlled oscillator 12 and the loop gain.

When the frequency of the incoming signal deviates by an amount such that the phase difference between the signal at input terminal 22 and the incoming signal at input terminal 24 is greater than the turning-point of phase detector 14, phase-locked loop 10 loses lock. If the frequency of the incoming signal varies beyond the frequency limits of crystal voltage controlled oscillator 12, phase-locked loop 10 also loses lock. When phase-locked loop 10 breaks lock, the DC component at output terminal 26 phase detector 14 disappears. These two break-points correspond to the cut-off frequencies of a band-pass filter.

Figure 2:
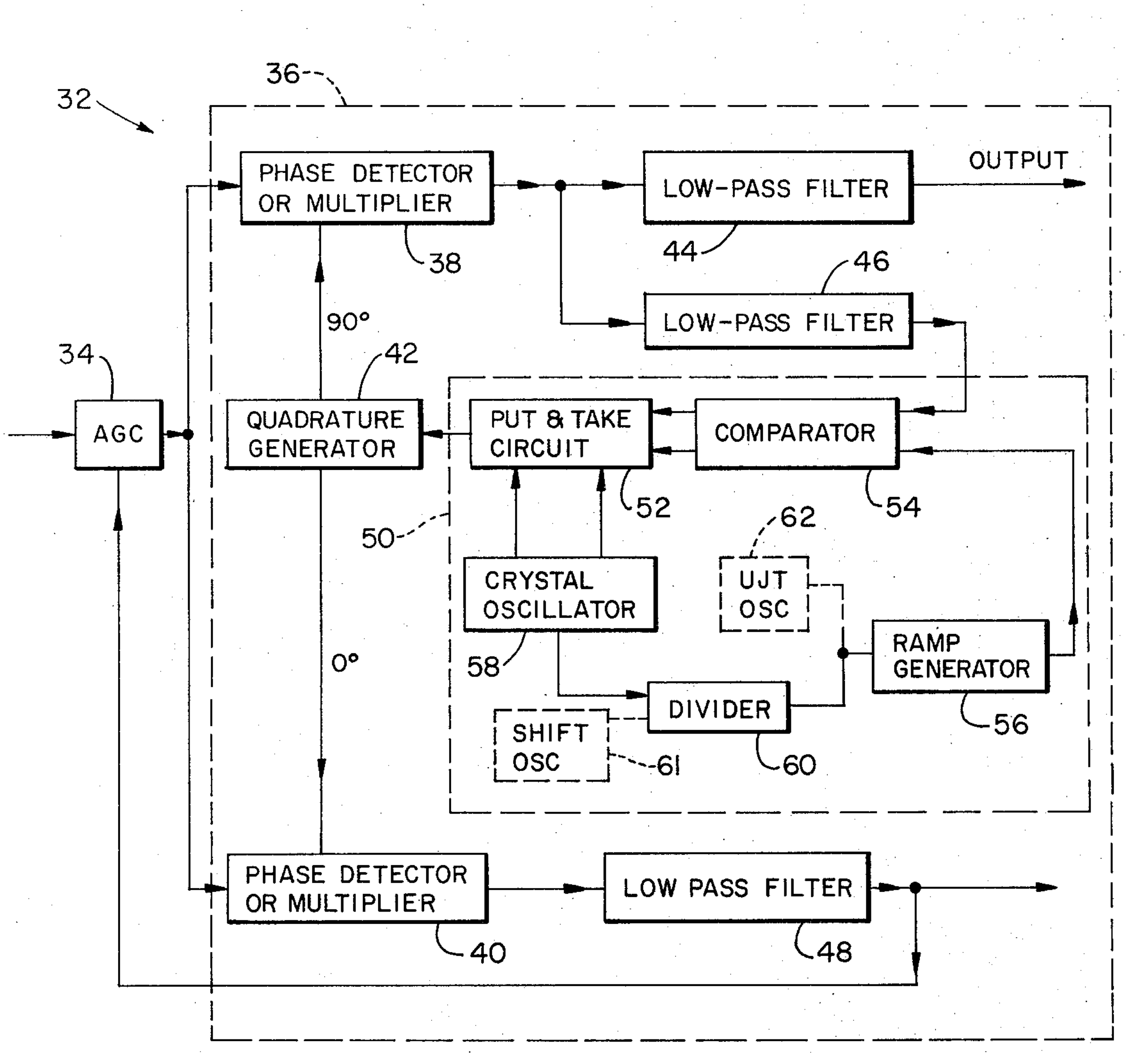
FIG. 2 is a block diagram of a narrow band receiver utilizing a crystal phase-locked loop.

Referring now to FIG. 2, there is shown a narrow band receiver 32 comprising an automatic gain control 34 and a crystal phase-locked loop 36 which operates as a discriminator. Crystal phase-locked loop 36 includes phase detectors 38, 40; a quadrature generator 42; low pass filters 44, 46, 48; and a crystal voltage controlled oscillator 50. An incoming signal is applied to phase detectors 38, 40 via automatic gain control 34. Quadrature signals at 90° and 0°, for example, which are generated by quadrature generator 42 are applied to phase detectors 38 and 40, respectively. Low pass filter 48 receives a signal from phase detector 40 and low pass filters 44, 46 receive a signal from phase detector 38. The signal at the output of low pass filter 48 is applied as a feedback signal to automatic gain control 34 for control thereof. The signal at the output of low pass filter 44 is the output signal of narrow band receiver 32. The signal at the output of low pass filter 46 is applied to crystal voltage controlled oscillator 50.

Crystal voltage controlled oscillator 50 comprises a PUT and TAKE circuit 52, a comparator 54, a ramp generator 56, a crystal oscillator 58 and a divider 60. Center and shift frequency signals derived from crystal oscillator 58 are combined selectively in PUT and TAKE circuit 52 which generates a signal having a frequency which varies linearly with a DC component applied to comparator 54 from low pass filter 46. It is to be understood that, in alternative embodiments, the shift frequency signal is generated from a shift oscillator 61. The center frequency signal is divided in divider 60 and is applied to ramp generator 56. It is to be understood that, in an alternative embodiment, ramp generator receives an input signal from a separate oscillator 62, for example a unijunction transistor oscillator, rather than the divided crystal oscillator signal. A signal having a ramp waveform is generated by ramp generator 56 and is fed to one input terminal of comparator 54 and a DC voltage as at the output of low pass filter 46 is applied to another input terminal of comparator 54. The instantaneous amplitude of the ramp waveform is compared to the DC voltage in comparator 54 which generates PUT and TAKE signals for processing in PUT and TAKE circuit 52. The center and shift frequency signals are selectively combined in PUT and TAKE circuit 52 as a function of the PUT and TAKE signals applied thereto from comparator 54. The frequency of the signal applied to quadrature generator 42 from PUT and TAKE circuit 52 is governed by the relative duration of the PUT and TAKE signals and varies linearly with changes in the DC voltage as at the output terminal of low pass filter 46.

Similar to the operation of phase-locked loop 10 in FIG. 1, crystal phase-locked loop 36 follows frequency shifts appearing at the output of automatic gain control 34. Phase detector 38 generates a DC signal which is proportional to the frequency shifts of the signal applied thereto from automatic gain control 34. The DC signal generated by phase detector 38 is fed to low pass filters 44 and 46. Low pass filter 46 drives comparator 54 which generates PUT and TAKE signals to PUT and TAKE circuit 52. Low pass filters 44, which has a tighter roll off than the low pass filter 46, furnishes the output signal of narrow band receiver 32. Phase detector 40 generates a signal having a DC level which is essentially constant over the expected range of frequency shifts. The DC signal at the output terminal of phase detector 40 is applied to automatic gain control 34 via low pass filter 48 for control thereof. By way of example the detailed circuitry of narrow band receiver 32 is shown in FIG. 3.

Figure 3:
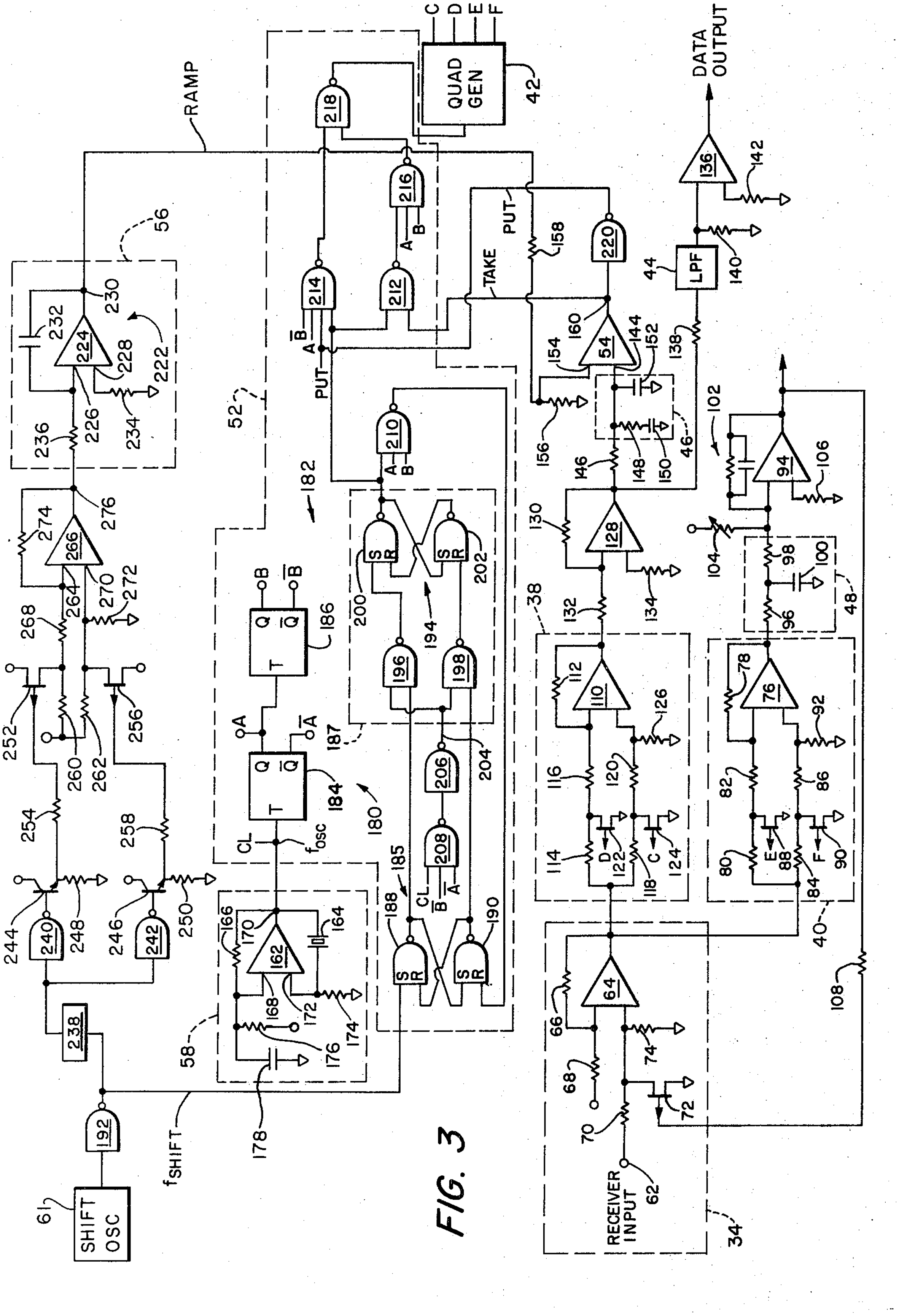
FIG. 3 is a detailed schematic diagram of the narrow band receiver of FIG. 2.

Referring now to FIG. 3, it will be seen that automatic gain control 34 comprises a terminal 62 adapted to receive the incoming signal and an operational amplifier 64 having a feedback circuit of resistors 66, 68. The incoming signal is coupled to amplifier 64 through a resistor 70. A field effect transistor 72 and a resistor 74 are connected between a return and the junction of resistor 70 and amplifier 64. The signal at the output of automatic gain control 34 is fed to phase detectors 38, 40.

Phase detector 40 comprises a differential input operational amplifier 76 having a feedback resistor 78. The signal at the output of automatic gain control 34 is fed in parallel to the input terminals of amplifier 76 through series resistors 80, 82 and series resistors 84, 86. A field effect transistor 90 is connected serially between the return and the junction of resistors 84, 86. A resistor 92 is connected between the return and the junction of resistor 86 and amplifier 76. The signal at the output of phase detector 40 is applied to the input of differential input operational amplifier 94 via low pass filter 48, which includes resistors 96, 98 and a capacitor 100. Resistor 96, 98 are serially connected between the output terminal of amplifier 76 and the input terminal of amplifier 94 and capacitor 100 is connected between the return and the junction of resistors 96, 98. Amplifier 94 is provided with a parallel RC feedback network 102. A variable resistor 104, defining an automatic gain control adjust, is connected serially between a source of voltage and the junction of resistor 98 and feedback network 102. Another input terminal of amplifier 94 is connected to the return through a resistor 106. The signal at the output terminal of amplifier 94 is fed to the gate of field effect transistor 72 through a resistor 108 for control of automatic gain control 34.

Phase detector 38 comprises a differential input operational amplifier 110 having a feedback resistor 112. The signal at the output of automatic gain control 34 is fed in parallel to the input terminals of amplifier 110 through series resistors 114, 116 and series resistors 118, 120. A field effect transistor 122 is connected serially between the return and the junction of resistor 114, 116 and a field effect transistor 124 is connected serially between the return and the junction of resistors 118, 120. A resistor 126 is connected between the return and the junction of resistor 120 and amplifier 110. The signal at the output of phase detector 38 is coupled through a resistor 132 to one input terminal of a differential input amplifier 128 having a feedback resistor 130. The other input terminal of amplifier 128 is connected to the return via a resistor 134. The signal at the output of amplifier 128 is coupled to a differential input amplifier 136 through a resistor 138 and low pass filter 44. A resistor 140 is connected between the return and the junction of low pass filter 44 and one input terminal of amplifier 136. The other input terminal of amplifier 136 is connected to the return through a resistor 142. The signal at the output of amplifier 136 is the output signal of narrow band receiver 32.

The signal at the output of amplifier 128 is coupled also to an input terminal 144 of comparator 54 through low pass filter 46 and a resistor 146. Low pass filter 46 includes a resistor 148 and capacitors 150, 152. Resistors 148 and capacitor 150 are connected in series between the return and terminal 144 and capacitor 152 is connected between the return and terminal 144. An input terminal 154 of comparator 54, which is connected to the return through a resistor 156, receives the ramp waveform signal as at the output of ramp generator 56 via a resistor 158. An output terminal 160 of comparator 54 is connected to PUT and TAKE circuit 52 which receives center frequency ($f_{osc}$) and shift frequency ($f_{shift}$) signal generated by crystal oscillator 58 and shift oscillator 61, respectively.

Crystal oscillator 58 comprises an operational amplifier 162 and a crystal 164. A feedback resistor 166 is connected between an input terminal 168 and an output terminal 170 of amplifier 162. Crystal 164 is connected between an input terminal 172 of amplifier 162 and output terminal 170. A resistor 174 is connected between terminal 172 and the return and a resistor 176 is connected between a source of voltage and terminal 168. A by-pass capacitor 178 is connected between the return and terminal 168. Output terminal 170 is connected to PUT and TAKE circuit 52.

PUT and TAKE circuit 52 comprises a divider 180 and associated gating circuitry 182. In the illustrated embodiment, by way of example, divider 180 is a counter and includes flip-flops 184, 186, each flip-flop having a trigger input terminal T and output terminals Q and $\overline{Q}$. For convenience, the signals presented at the Q and $\overline{Q}$ terminals of flip-flop 184 are denoted by the characters A and $\overline{A}$, respectively, and the signals presented at the Q and $\overline{Q}$ terminals of flip-flops 186 are denoted by the characters B and $\overline{B}$. It is to be understood that A and B represent high logic levels, for example digital ones; and $\overline{A}$ and $\overline{B}$ represent low logical signals, for example digital zeros. The signal ($f_{osc}$) at output terminal 170 is applied to trigger input terminal T of flip-flop 184. The Q output terminal of flip-flop 184 is connected to the trigger input terminal T of flip-flop 186. In the preferred embodiment, by way of example, counter 180 is a divide by four counter, each flip-flop 110, 112 operating as a divide by two counter. It is to be understood that, in alternative embodiments, divider 180 is other than a counter, for example a shift register. The A, $\overline{A}$, B and $\overline{B}$ signals are processed in gating circuits 182 is the manner hereinafter described.

Gating circuitry 182 comprises a latch 185 and a clocked NAND gate flip-flop 187. Latch 185 includes NAND gates 188 and 190, each NAND gate 188, 190 having a set terminal, a reset terminal and an output terminal. The set and reset terminals of NAND gates 188, 190 are denoted by the characters S and R, respectively. The set terminal of NAND gate 188 is connected to the output terminal of a NAND gate 192 and the set terminal of NAND gate 190 is connected to the output terminal of NAND gate 178. The output terminals of NAND gates 188 and 190 are further connected to clocked NAND gate flip-flop 187.

Clocked NAND gate flip-flop 187 includes a latch 194 and NAND gates 196, 198. Latch 194 includes NAND gates 200, 202; each NAND gate 200, 202 having a set terminal, a reset terminal and an output terminal. The set and reset terminals of NAND gates 200, 202 are denoted by the characters S and R, respectively. The reset terminal of NAND gate 200 is connected to the output terminal of NAND gate 202 and the set terminal of NAND gate 202 is connected to the output terminal of NAND gate 200. The output terminals of NAND gates 196 and 198 are connected respectively to the set terminal of NAND gate 200 and the reset terminal of NAND gate 202. One input terminal of each NAND gate 196 and 198 is tied to a common trigger line 204. The other input terminal of NAND gates 196 and 198 is connected to the output terminal of NAND gates 188 and 190, respectively. Common trigger line 204 is connected to an output terminal of a NAND gate 206. An input terminal of NAND gate 206 is connected to an output terminal of a three input terminal NAND gate 208. The $\overline{A}$, $\overline{B}$ and ($f_{osc}$) signals are applied to the three input terminals of NAND gate 208, one signal being applied to one input terminal thereof. The output terminal of NAND gate 200 is connected to one input of NAND gates 210, 212 and 214.

NAND gate 210, for example a three input terminal NAND, receives the A and B signals at its other two input terminals. The output terminal of NAND gate 210 is connected to the reset terminal of NAND gate 190. NAND gate 212, for example a two input terminal NAND gate, receives on its second input terminal the TAKE signal generated by comparator 54. An output terminal of NAND gate 212 is connected to one input terminal of a three input terminal NAND gate 216, the A and B signals being applied to the other two input terminals thereof. The output terminal of NAND gate 216 is tied to one input terminal of a two input terminal NAND gate 218. The other input terminal of NAND gate 218 is connected to the output terminal of NAND gate 214, for example a four input terminal NAND gate. The PUT signal as at the output terminal of a NAND gate 220 which is fed by comparator 54, is applied to two of the free input terminals of NAND gate 214. The A and B signals generated by divider 180 are applied to the remaining free input terminals of NAND gate 214. The PUT and TAKE signals applied to NAND gates 214 and 212, respectively, are derived from comparator 54 which receives the input DC voltage as at the output of low pass filter 46 and the ramp waveform from ramp generator 56.

In the illustrated embodiment, ramp generator 56 is in the form of an integrator 22 comprising an operation amplifier 224 having differential input terminals 226, 228 and an output terminal 230. A capacitor 232 is connected between output terminal 230 and input terminal 226. Input terminal 228 is connected to the return through a resistor 234 and output terminal 230 is connected to input terminal 154 of comparator 54. The shift frequency signal is applied to input terminal 226 through a resistor 236.

The shift frequency signal as at the output terminal of NAND gate 192 is applied to a divider 238, the output terminal of which is connected to the input terminals of NAND gates 240, 242. The output terminals of NAND gates 240 and 242 are connected respectively to the base contacts of transistors 244 and 246. The emitter contacts of transistors 244 and 246 are connected to the return through resistors 248 and 250, respectively. The emitter contact of transistor 244 is further connected to the gate of a field effect transistor 252 through a resistor 254 and the emitter contact of transistor 246 is further connected to the gate of a field effect transistor 256 through a resistor 258. The drains of field effect transistors 252 and 256 are connected to a source of voltage through resistors 260 and 262, respectively. The junction of the drain of field effect transistor 252 and resistor 260 is further connected to an input terminal 264 of a differential input operational amplifier 266 through a resistor 168. Another input terminal 270 of amplifier 266 is connected to the junction of the drain of field effect transistor 256 and resistor 262. Input terminal 270 is connected also to the return through a resistor 272. A feedback resistor 274 is connected between input terminal 264 and an output terminal 276 of amplifier 266. The shift frequency signal at output terminal 276 of amplifier 266 is fed to input terminal 266 of amplifier 224 via resistor 236.

As previously indicated, the ($f_{osc}$) and ($f_{shift}$) signals are combined selectively in PUT and TAKE circuit 52 for generating a signal having a frequency which varies linearly with changes in the input DC voltage. The ($f_{shift}$) signal at the output terminal of NAND gate 192 operates to set latch 185. The signals at the output of latch 185 are gated with the $\overline{A}$ and $\overline{B}$ signals generated by divider 180 and the ($f_{osc}$) signal generated by crystal oscillator 58 via NAND gates 208, 206, 196 and 198 in order to set latch 194. The signal at the output of latch 194 is gated with the A and B signals in NAND gate 210 to reset latch 185. The signal at the output of latch 194 is gates also with the TAKE signal in NAND gate 212 and with the A,$\overline{B}$ and PUT signals in NAND gate 214.

When the DC voltage applied to comparator 54 from low pass filter 46 is at return potential, the signal at the output of comparator 54 is low during one half of the ramp period and high during the other half of the ramp period. The number of PUT signal pulses applied to NAND gate 214 is equivalent to the number of TAKE signal pulses applied to NAND gate 212. The PUT signal pulses are gated with the TAKE signal pulses via NAND gate 216 in NAND gate 218 to generate an output signal at center frequency.

When the input DC voltage is at a positive potential with respect to the return, the output signal of comparator 54 is low during a greater portion of the ramp period and high during a lesser portion of the ramp period. The number of PUT signal pulses applied to NAND gate 214 is greater than the number of TAKE signal pulses applied to NAND gate 212. The increased PUT signal pulses, via NAND gates 214 and 218 operate to increase the frequency of the output signal. That is, NAND gate 218 produces an output signal for every fourth pulse of the ($f_{osc}$) signal pulse the pulses of the ($f_{shift}$) signal.

When the input DC voltage is at a negative potential with respect to the return, the output signal of comparator 54 is high during a greater portion of the ramp period and low during a lesser portion of the ramp period. The number of TAKE pulses applied to NAND gate 212 is greater than the number of PUT signal pulses applied to NAND gate 214. The increased TAKE pulses via NAND gate 212 operates to inhibit the output signal of NAND gate 216 and the next A and B transistion of counter 180. That is, NAND gate 218 produces an output signal for every fourth pulse of the ($f_{osc}$) signal minus the pulses of the ($f_{shift}$) signal. The signal of the output of NAND gate 218 is applied to quadrature generator 42 which generates command signals C, D, E and F for controlling the conduction states of field effect transistors 122, 124, 88 and 90, respectively, via a divider 278. The operation of the remaining circuitry shown in FIG. 3 is as described in connection with FIG. 2.

Since certain changes may be made in the foregoing disclosure without departing from the scope of the invention herein involved, it is intended that all matter contained in the above description and depicted in the accompanying drawings be construed in an illustrative and not in a limiting sense.

What is claimed is:

1. A crystal phase lock loop comprising:

a. crystal voltage controlled oscillator means having input and output terminals;

b. phase detector means having a pair of input terminals and an output terminal, said crystal voltage controlled oscillator means output terminal connected to one of said phase detector means input terminals, an input signal received at the other of said phase detector means input terminals, said phase detector means generating a combined signal including sum and difference frequency signals of said input signal and a signal generated by said crystal voltage controlled oscillator means, said combined signal presented at said phase detector means output terminal; and c. loop filter means having input and output terminals, said loop filter means input terminal connected to said phase detector means output terminal, said loop filter means output terminal output terminal connected to said crystal voltage controlled oscillator means, said combined signal applied to said loop filter means, said difference frequency signal presented at said loop filter means output terminal, said sum frequency signal filtered out by said loop filter means, said difference frequency signal applied to said crystal voltage controlled oscillator means for control thereof, said crystal voltage controlled oscillator means generating a signal having a frequency determined by said difference frequency signal;

d. said crystal voltage controlled oscillator means including i. crystal oscillator means for generating a first signal of precise frequency;

ii. shift means for generating a shift frequency signal, the frequency of said shift frequency signal having a frequency related to said first signal;

iii. generator means for generating a second signal having a given waveform, said second signal derived from said first signal;

iv. comparator means connected to said generator means and loop filter means for comparing the instantaneous amplitude of said second signal with a DC voltage as at said loop filter means output terminal, said comparator means generating PUT and TAKE signals related to said comparison; and v. PUT and TAKE means connected to said crystal oscillator means and said comparator means for selectively combining said first and shift frequency signals as a function of said PUT and TAKE signals and for generating a signal having a frequency related to said difference frequency signal, the frequency of said signal generated by said PUT and TAKE means governed by the relative duration of said PUT and TAKE signals and varies linearly with changes in the DC voltage at said loop filter means output terminal.

2. The crystal phase lock loop as claimed in claim 1 wherein said loop filter means is a low pass filter.

3. The voltage controlled crystal oscillator as claimed in claim 1 wherein said generator means is a ramp generator and said given waveform is a ramp.

4. The voltage controlled crystal oscillator as claimed in claim 1 wherein said shift means is a divider connected between said crystal oscillator means and said PUT and TAKE means, said shift frequency signal derived from said first signal.

5. A narrow band receiver comprising:
a. crystal voltage controlled oscillator means for generating an output signal having a frequency related to an input signal;
b. first phase detector means having at least a pair of input terminals and an output terminal, one of said first phase detector means input terminals connected to said crystal voltage controlled oscillator means, said crystal voltage controlled oscillator means output signal applied to one of said first phase detector means input terminals, a receiver input signal applied to the other of said first phase detector means input terminals, said first phase detector means selectively combining said voltage controlled oscillator means output signal and said receiver input signal, said first phase detector means generating a combined signal having sum and difference frequency signals of said voltage controlled oscillator means output signal and said receiver input signal;
c. first filter means having input and output terminals, said first phase detector means output terminal connected to said first filter means input terminal, said first filter means output terminal connected to said crystal voltage controlled oscillator means, said first filter means operating to filter out said sum frequency signal, said difference frequency signal presented at said first filter output terminal applied to said crystal voltage controlled oscillator means as said input signal; and
d. second filter means having input and output terminals, said first phase detector means output terminal connected to said second filter means input terminal, a receiver output signal presented at said second filter means output terminal;
e. said crystal voltage controlled oscillator means including
i. crystal oscillator means for generating a first signal of precise frequency;
ii. shift means for generating a shift frequency signal, the frequency of said shift frequency signal having a frequency related to said first signal;
iii. generator means for generating a second signal having a given waveform, said second signal derived from said first signal;
iv. comparator means connected to said generator means and said first filter means for comparing the instantaneous amplitude of said second signal with a DC voltage as at said first filter means output terminal, said comparator means generating PUT and TAKE signals related to said comparison; and
v. PUT and TAKE means connected to said crystal oscillator means and said comparator means for selectively combining said first and shift frequency signals as a function of said PUT and TAKE signals and for generating a signal having a frequency related to said difference frequency signal, the frequency of said signal generated by said PUT and TAKE means governed by the relative duration of said PUT and TAKE signals and varies linearly with changes in the DC voltage at said first filter means output terminal.

6. A narrow band receiver comprising:
a. crystal voltage controlled oscillator means for generating an output signal having a frequency related to an input signal;
b. first phase detector means having at least a pair of input terminals and an output terminal, one of said first phase detector means input terminals connected to said crystal voltage controlled oscillator means, said crystal voltage controlled oscillator means output signal applied to one of said first phase detector means input terminals, a receiver input signal applied to the other of said first phase detector means input terminals, said first phase detector means selectively combining said voltage controlled oscillator means output signal and said receiver input signal, said first phase detector means generating a combined signal having sum and difference frequency signals of said voltage controlled oscillator means output signal and said receiver input signal;
c. first filter means having input and output terminals, said first phase detector means output terminal connected to said first filter means input terminal, said first filter means output terminal connected to said crystal voltage controlled oscillator means, said first filter means operating to filter out said sum frequency signal, said difference frequency signal presented at said first filter output terminal applied to said crystal voltage controlled oscillator means as said input signal;
d. second filter means having input and output terminals, said first phase detector means output terminal connected to said second filter means input terminal, a receiver output signal presented to said second filter means output terminal;
e. quadrature generator means having an input terminal and at least a pair of output terminals for generating first and second output signals, said first and second output signals being in quadrature with respect to each other, said quadrature generator input terminal connected to said crystal voltage controlled oscillator means output terminal, said quadrature generator responsive to said output signal generated by said crystal voltage controlled oscillator means, one of said quadrature generator means output terminals connected to said one of said first phase detector means input terminal, said first output signal applied to said first phase detector means;
f. second phase detector means having at least a pair of input terminals and an output terminal, one of said second phase detector means input terminals connected to the other of said quadrature generator means output terminals, said second output signal applied to said one second phase detector means input terminal, said receiver input signal applied to the other of said second phase detector means input terminals, said second phase detector means generating an output signal related to said signals applied to said input terminals thereof;
g. automatic gain control means having input and output terminals, said receiver input signal applied to said automatic gain control means input terminal, said other input terminals of said first and second phase detector means connected to said automatic gain control means output terminal, said automatic gain control means operating to regulate the signal applied to said first and second phase detector means; and
h. third filter means having input and output terminals, said third filter means input terminal connected to said second phase detector means output terminal, said third filter means output terminal connected to said automatic gain control means, a signal at said third filter means output terminal operating to control said automatic gain control means.

7. The narrow band receiver as claimed in claim 6 wherein said crystal voltage controlled oscillator means includes:

a. crystal oscillator means for generating a first signal of precise frequency;

b. shift means for generating a shift frequency signal, said shift frequency signal having a frequency related to the frequency of said first signal;

c. generator means for generating a second signal having a given waveform, said second signal derived from said first signal;

d. comparator means connected to said generator means and said first filter means output terminal, said comparator means comparing the instantaneous amplitude of said second signal and a DC voltage at said first filter means output terminal and for generating PUT and TAKE signals related to said comparison; and e. PUT and TAKE means connected to said crystal oscillator means and said comparator means for selectively combining said first and shift frequency signals as a function of PUT and TAKE signals and for generating an output signal having a frequency related to said difference frequency signal, said PUT and TAKE means connected to said quadrature generator means input terminal, the frequency of said signal generated by said PUT and TAKE means governed by the relative duration of said PUT and TAKE signals and varies linearly with changes in the DC voltage at said first filter means output terminal.

8. The narrow band receiver as claimed in claim 7 wherein said PUT and TAKE means including counter means and logic means, said counter means connected between said crystal oscillator means and said logic means, said counter means operating to generate high and low logic level signals for selectively gating said logic means.

9. The voltage controlled crystal oscillator as claimed in claim 8 wherein said generator means is a ramp generator and said given waveform is a ramp.

10. The voltage controlled crystal oscillator as claimed in claim 9 wherein said shift means is a divider connected between said crystal oscillator means and said PUT and TAKE means, said shift frequency signal derived from said first signal.

* * * * *